(12) United States Patent
Myung

(10) Patent No.: US 8,907,393 B2
(45) Date of Patent: Dec. 9, 2014

(54) SEMICONDUCTOR DEVICE HAVING BURIED BIT LINES AND METHOD FOR FABRICATING THE SAME

(71) Applicant: SK Hynix Inc., Gyeonggi-do (KR)

(72) Inventor: Ju-Hyun Myung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 168 days.

(21) Appl. No.: 13/718,607

(22) Filed: Dec. 18, 2012

(65) Prior Publication Data

US 2014/0001527 A1 Jan. 2, 2014

(30) Foreign Application Priority Data

Jun. 29, 2012 (KR) ........................ 10-2012-0071164

(51) Int. Cl.
| H01L 27/108 | (2006.01) |
| H01L 29/94 | (2006.01) |
| H01L 23/538 | (2006.01) |
| H01L 21/02 | (2006.01) |
| H01L 27/04 | (2006.01) |
| H01L 27/105 | (2006.01) |
| H01L 29/66 | (2006.01) |

(52) U.S. Cl.
CPC ...... *H01L 23/5384* (2013.01); *H01L 21/02697* (2013.01); *H01L 27/04* (2013.01); *H01L 27/105* (2013.01); *H01L 27/10852* (2013.01); *H01L 27/10814* (2013.01); *H01L 29/66621* (2013.01); *H01L 27/10823* (2013.01); *H01L 27/10885* (2013.01); *H01L 27/10876* (2013.01)
USPC ........... 257/296; 257/329; 257/330; 257/384; 438/237; 438/268; 438/270; 438/589; 438/655

(58) Field of Classification Search
CPC ............ H01L 27/105; H01L 27/10814; H01L 27/10855; H01L 27/10852; H01L 27/10876; H01L 29/66621
USPC .......... 257/296, 330, 329; 438/239, 268, 270, 438/589, 655
See application file for complete search history.

(56) References Cited

U.S. PATENT DOCUMENTS

| 7,736,969 | B2 | 6/2010 | Abbott et al. | |
| 8,187,952 | B2 * | 5/2012 | Kim et al. | 438/453 |
| 8,779,422 | B2 * | 7/2014 | Lee et al. | 257/51 |
| 2011/0104894 | A1 * | 5/2011 | Kim et al. | 438/666 |
| 2011/0129974 | A1 * | 6/2011 | Eun et al. | 438/268 |
| 2011/0189843 | A1 * | 8/2011 | Lee et al. | 438/513 |
| 2012/0171846 | A1 * | 7/2012 | Hwang | 438/478 |
| 2013/0102118 | A1 * | 4/2013 | Lee et al. | 438/270 |
| 2013/0119464 | A1 * | 5/2013 | Lee et al. | 257/332 |
| 2013/0240965 | A1 * | 9/2013 | Park et al. | 257/296 |
| 2014/0170828 | A1 * | 6/2014 | Lee et al. | 438/305 |

FOREIGN PATENT DOCUMENTS

KR 1020080046867 5/2008

* cited by examiner

*Primary Examiner* — Ngan Ngo

(74) *Attorney, Agent, or Firm* — IP & T Group LLP

(57) ABSTRACT

A semiconductor device including buried bit lines formed of a metal silicide and silicidation preventing regions formed in a substrate under trenches that separate the buried bit lines.

21 Claims, 16 Drawing Sheets

SEMICONDUCTOR DEVICE HAVING BURIED BIT LINES AND METHOD FOR FABRICATING THE SAME

CROSS-REFERENCE TO RELATED APPLICATION

The present application claims priority of Korean Patent Application No. 10-2012-0071164, filed on Jun. 29, 2012, which is incorporated herein by reference in its entirety.

BACKGROUND

1. Field

Exemplary embodiments of the present invention relate to a semiconductor device fabrication technology, and more particularly, to a semiconductor device having buried bit lines and a method for fabricating the same.

2. Description of the Related Art

Most semiconductor devices include transistors. For example, in a memory device, such as a DRAM, a memory cell includes a MOSFET. In general, since source/drain regions of a MOSFET are formed in a surface of a semiconductor substrate and a planar channel is formed between the source region and the drain region. Such a general MOSFET is referred to as a planar channel transistor.

As demands for improvements in the degree of integration and performance of a memory device increase, a technology for fabricating a MOSFET is faced with physical limitations. For example, as the size of a memory cell shrinks, the size of a MOSFET shrinks. As a result, the channel length of the MOSFET is shortened. When the channel length of a MOSFET is shortened, the properties of maintaining data are likely to deteriorate, and the characteristics of the memory device may be degraded.

In consideration of these problems, a vertical channel transistor (VCT) has been suggested in the art. In the vertical channel transistor, junction regions are formed at respective ends of a pillar, and any one junction region is connected with a bit line. The bit line is formed by being buried in a trench defined between pillars, and accordingly, is referred to as a buried bit line (BBL).

Two memory cells, each including a VCT and a BBL, are adjacent to one BBL. Therefore, the one BBL is formed in a space (trench) between memory cells, and an OSC (one-side-contact) process is performed to connect one memory cell with one BBL. The OSC process allows each BBL to be brought into contact with any one of two adjacent memory cells. Thus, the OSC process is also referred to as a single-side-contact (SSC) process. Generally, in a memory device that uses a planar channel transistor, in order to connect the planar channel transistor with a bit line, a contact plug process with a high aspect ratio is required. Conversely, in the case of using a vertical channel transistor and a buried bit line, since the vertical channel transistor and the buried bit line may be brought into direct contact with each other, a contact plug process is not required. Hence, the parasitic capacitance of the bit line may be reduced.

FIG. 1 is a cross-sectional view illustrating buried bit lines according to the conventional art.

Referring to FIG. 1, a plurality of bodies 14, which are separated by trenches 13, are formed in a substrate 11. The bodies 14 are formed through an etching process for the substrate 11, using a hard mask layer 12. A protective layer 15 is formed on the side walls of the bodies 14 and on the surfaces of the substrate 11 that define trenches 13. Open parts 17 are defined in the protective layer 15 through an OSC process. Each open part 17 exposes a sidewall of each body 14. Buried bit lines 16 are formed in the trenches 13. The buried bit lines 16 are connected with the bodies 14 through the open parts 17. Each buried bit line 16 is connected with one of two adjacent bodies 14. While not shown in the drawing, the upper portion of each body 14 includes a pillar in which source/drain regions and a channel of a vertical channel transistor are formed.

As can be seen from FIG. 1, in order to connect each buried bit line 16 to the sidewall of one of the adjacent bodies 14, an OSC process is used. In order to implement the OSC process, various methods such as a liner layer and a tilt ion implantation process, an OSC mask process, and the like have been proposed.

However, these methods fail to form a uniform and reproducible OSC structure due to difficulties in processing. Also, as the level of integration increases, a problem occurs in that the distance between adjacent buried bit lines 16 becomes narrow and parasitic capacitance $C_B$ between adjacent buried bit lines 16 increases. Since the buried bit lines 16 are brought into contact with the bodies 14, the parasitic capacitance $C_B$ between buried bit lines 16 acts as a capacitance between the body 14 and the buried bit line 16. Accordingly, because the distance between adjacently buried bit lines 16 becomes narrow, the parasitic capacitance $C_B$ increases markedly.

If the parasitic capacitance $C_B$ between buried bit lines increases in this way, the operation of a device may become impossible.

SUMMARY

Embodiments of the present invention are directed to a semiconductor device having buried bit lines, which can reduce the parasitic capacitance between adjacent buried bit lines and a method for fabricating the same.

In accordance with an embodiment of the present invention, A method for fabricating a semiconductor device may include: etching a substrate to form a plurality of bodies, having sidewalls, separated by a plurality of trenches, where each trench, of the plurality of trenches is defined by a pair of sidewalls of corresponding ones of the plurality of bodies; forming, in the substrate under each trench, of the plurality of trenches, silicidation preventing regions, where the silicidation preventing regions are to prevent metal silicides from being formed in the substrate during a silicidation process; and performing a silicidation process on the sidewalls of the plurality of bodies to form buried bit lines in each body, of the plurality of bodies, where lower surfaces of the buried bit lines are substantially co-planar with bottoms of the plurality of trenches.

In accordance with another embodiment of the present invention, a method for fabricating a semiconductor device may include: etching a silicon-containing substrate to form a plurality of bodies, having sidewalls, separated by a plurality of trenches, where each trench, of the plurality of trenches is defined by a pair of sidewalls of corresponding ones of the plurality of bodies; forming a passivation layer on the pairs of sidewalls; forming silicidation preventing regions in the substrate under the trenches; etching the passivation layer to define open parts that are substantially co-planar with bottoms of the plurality of trenches and that expose the pair of sidewalls; forming a metal-containing layer over the pairs of sidewalls exposed by the open parts; forming a metal silicide layer through a full thickness of each body, of plurality of bodies by silicidating a portion of each body, of the plurality of bodies, that is exposed by the open parts; removing any remaining metal-containing layer; and forming an interlayer dielectric layer to fill spaces between the plurality of bodies.

In accordance with yet another embodiment of the present invention, a method for fabricating a semiconductor device may include: etching a substrate to form a plurality of bodies, having sidewalls, separated by a plurality of trenches, where each trench, of the plurality of trenches is defined by a pair of sidewalls of corresponding ones of the plurality of bodies; forming silicidation preventing regions in the substrate under each trench of the plurality of trenches; performing silicidation on the pairs of sidewalls to form buried bit lines in each body, of the plurality of bodies, where lower surfaces of the buried bit lines are substantially co-planar with bottoms of the plurality of trenches; and etching the plurality of to form a plurality of pillars that are to connect with corresponding capacitors and include channel regions for vertical channel transistors.

In accordance with still another embodiment of the present invention, a semiconductor device may include: a substrate; a plurality of bodies defined in the substrate, where the plurality of bodies are separated from one another by trenches that are defined by sidewalls of the plurality of bodies and by a surface of the substrate; buried bit lines, made of a metal silicide, formed in each of the plurality of bodies, where a bottom surface of each of the buried bit lines is substantially co-planar with surfaces defining bottoms of the trenches; and silicidation preventing regions formed in the substrate under the trenches, where the silicidation preventing regions are to prevent metal silicides from being formed in the substrate during a silicidation process.

DETAILED DESCRIPTION

Figure 1:
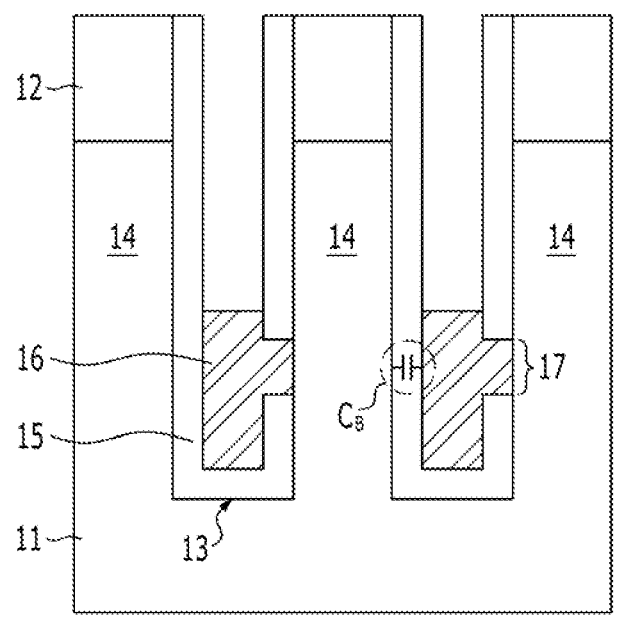
FIG. 1 is a view illustrating conventional buried bit lines.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In an embodiment of the present invention, which will be described later, in order to reduce the parasitic capacitance between adjacent buried bit lines, buried bit lines are not formed in the spaces (trenches) between bodies, but are formed in the bodies. In order to form the buried bit lines in the bodies, for example, a BSC (both-side-contact) process may be used. For reference, the BSC process is also referred to as a DSC (double-side-contact) process.

A method for fabricating buried bit lines using a BSC process will be described below with reference to FIGS. 2A to 2E. FIGS. 2A to 2E are cross-sectional views illustrating the processes of the method for fabricating buried bit lines using a BSC process.

Figure 2A:
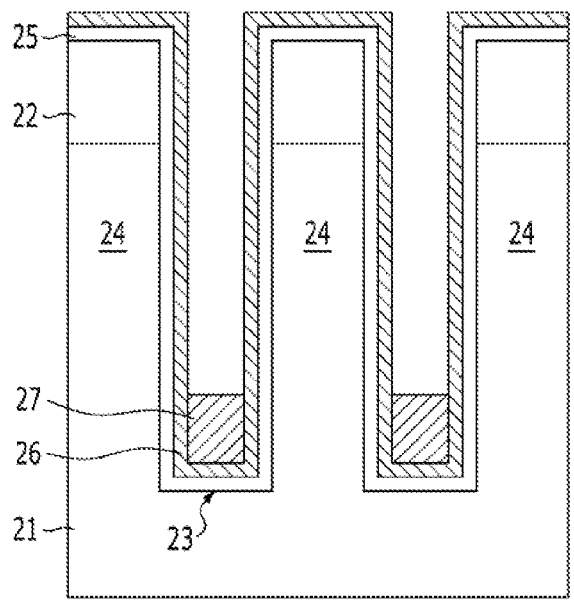
FIGS. 2A to 2E are views showing a method for fabricating buried bit lines, using a BSC process.

Referring to FIG. 2A, a plurality of trenches 23 are defined by etching a substrate 21, for example, a silicon substrate, using hard mask patterns 22 on the substrate 21 as an etch mask. In this way, a plurality of bodies 24 are formed and separated by the trenches 23. The bodies 24 are formed perpendicular to a surface of the substrate 21, and may be linear. Accordingly, each body 24 may have a pair of sidewalls.

Passivation layers with etching selectivities are formed on the sidewalls of the bodies 24. The passivation layers may be formed as a stacked layer in which a first passivation layer 25 and a second passivation layer 26 are stacked. For example, the first passivation layer 25 may be an oxide layer, and the second passivation layer 26 may be a nitride layer.

A first sacrificial layer 27 is formed on the second passivation layer 26 to partially fill the trenches 23. The first sacrificial layer 27, which partially fills the trenches 23, may be formed by forming the first sacrificial layer 27 on the entire surface of the substrate 21 to fill the trenches 23, planar z ng an upper surface of the first sacrificial layer 27 and performing a blanket etching process, for example, etch-back. The first sacrificial layer 27 may have an etching selectivity that is different from an etching selectivity of the first and second passivation layers 25 and 26. For example, the first sacrificial layer 27 may made of silicon.

Figure 2B:
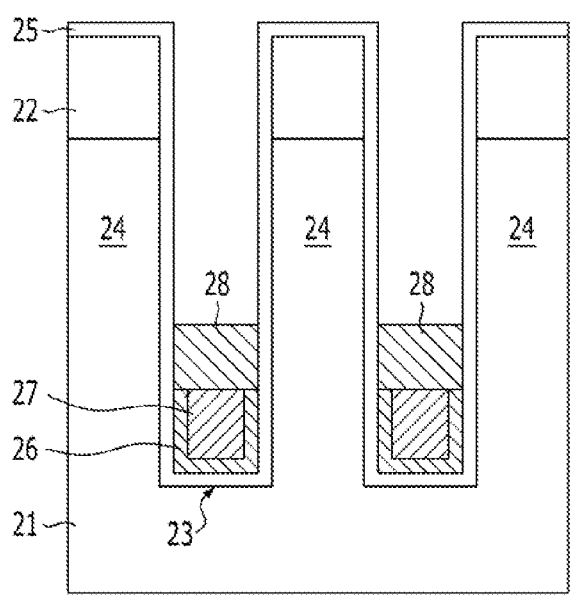

Referring to FIG. 2B, a portion of the second passivation layer 26 that is exposed by the first sacrificial layer 27 is selectively removed. Thus, the second passivation layer 26 may be flush with the first sacrificial layer 27.

A second sacrificial layer 28 is formed on the first sacrificial layer 27 and partially fills the trenches 23. The second sacrificial layer 28 may be formed by forming the second sacrificial layer 28 on the entire surface of the substrate 21 to fill the trenches 23, planarizing the upper surface of the second sacrificial layer 28 and performing a blanket etching process, for example, etch-back. The second sacrificial layer 28 may be made of silicon.

Figure 2C:
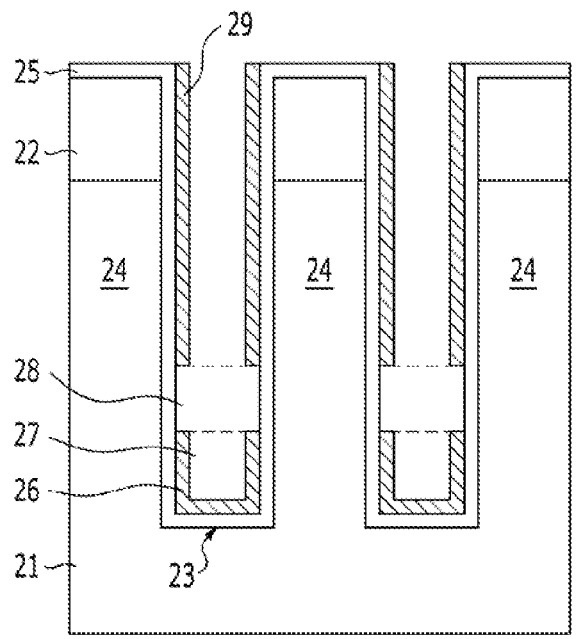

Referring to FIG. 2C, a third passivation layer 29 is formed on a surface of the second sacrificial layer 28. The second passivation layer 28 is subsequently etched so that the third passivation layer 29 remains in the form of spacers on the sidewalls of the trenches 23 and a portion of the first passivation layer 25 is exposed. The third passivation layer 29 may be made of a nitride The first passivation layer 25 and the third passivation layer 29 are not removed since they have etching selectivities that are different than the etching selectivity of the second sacrificial layer 28.

Figure 2D:
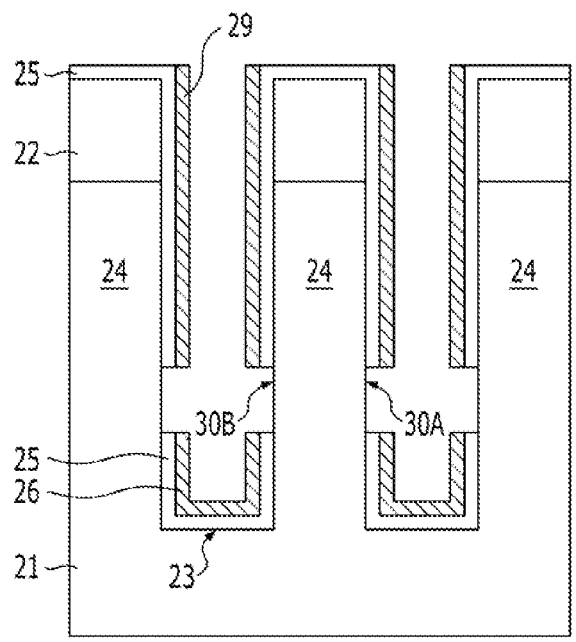

As shown in FIG. 2D, the first sacrificial layer 27 that is exposed due to removal of the second sacrificial layer 28 is removed to expose the second passivation layer 26.

The exposed portion of first passivation layer 25 is selectively removed, and as a consequence, open parts 30A and 30B that partially open both sidewalls of the bodies 24 are defined. The open parts 30A and 30B may be linear shapes that extend on the sidewalls of the bodies 24.

The process for forming the open parts 30A and 30B as described above are referred to as a BSC (both-side-contact) process. The BSC process is contrasted with the OSC (one-side-contact) process. While the OSC process is a process for opening only any one of both side alls of each body, the BSC process is a process for opening both sidewalls of each body 24. Furthermore, since the BSC process, unlike the OSC process, is simple and tilt ion implantation and does not use an OSC mask, productivity and reproducibility are excellent.

Figure 2E:
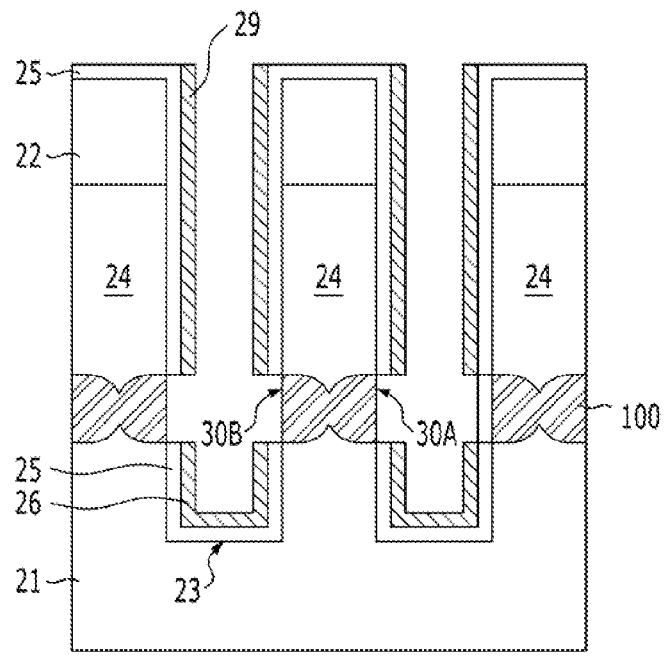

Referring to FIG. 2E, by performing annealing, after forming a metal-containing layer (not shown) on the surface of the structure including the open parts 30A and 308, metal silicides 100 are formed in the bodies 24 and are exposed through the open parts 30A and 308. The metal silicides 100 are buried in the bodies 24, and serve as buried bit lines (BBL). Hereinafter, the metal silicides 100 are referred to as "buried bit lines 100"

While not shown, the remaining metal-containing layer is removed, and additional annealing for improving the characteristics of the buried bit lines may be performed.

Since the buried bit lines 100, formed through the above-described processing procedures, are buried in the bodies 24, the parasitic capacitance between adjacent buried bit lines 100 may be effectively reduced when compared to the OSC structure. Moreover, since a metal suicide is used as the material of the buried bit lines 100, the sheet resistance (RS) of the buried bit lines 100 may be reduced.

However, in the above-described BSC process, because the open parts 30A and 30B are separated, in the direction perpendicular to the surface of the substrate, from bottoms of the trenches 23, which isolate adjacent buried bit lines 100 from each other and prevent a punch-through phenomenon, a problem is caused in that the open parts 30A and 30B may not be uniformly defined at the same position. This will be described in detail with reference to FIG. 3.

Figure 3:
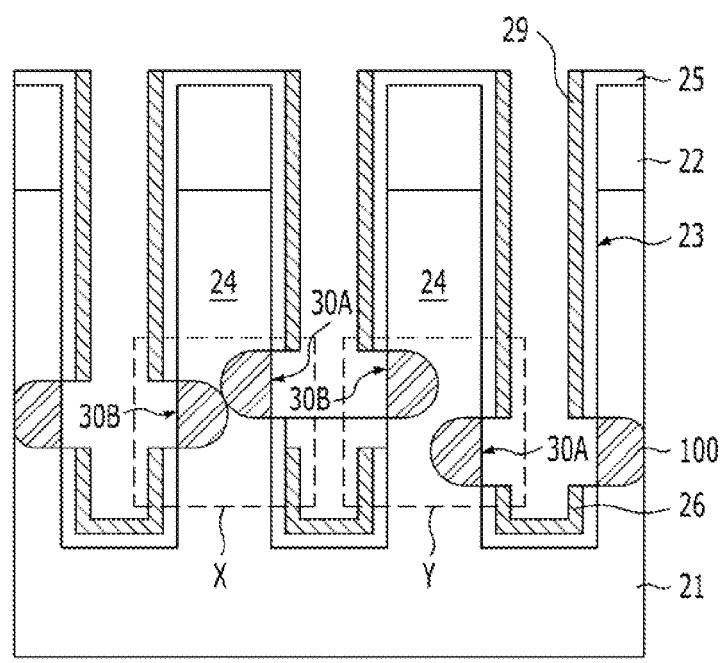
FIG. 3 is a view showing the case in which open parts defined through the BSC process are not uniformly defined at the same position.

FIG. 3 is a view showing the case in which open parts defined through the BSC process are not uniformly defined at the same position. Herein, for the sake of convenience in explanation, the same reference numerals as those used in FIGS. 2A to 2E will be used.

Referring to FIG. 3, when the position of the open parts 30A and 30B are defined to be separated from the bottoms of the trenches 23 by a predetermined distance in the direction perpendicular to the surface of the substrate, using the blanket etching processes for the first sacrificial layer 27 and the second sacrificial layer 28 (as described above), a problem may be caused in that a critical process margin for height control may be insufficient and thus, the open parts 30A and 30B may not be uniformly formed at the same position.

In each buried bit line 100 that is formed through the BSC process, signal transfer characteristics (or low resistance characteristics) required by the semiconductor device may be secured only when a metal silicide formed from one open part 30A of each body 24 and a metal silicide formed from the other open part 30B of the body 24 are connected with each other in an aligned state.

For example, if the open parts 30A and 30B are not uniformly formed at the same position, a problem may be caused in that each buried bit line 100 may be formed to have a structure in which a metal silicide formed from one open part 30A of each body 24 and a metal silicide formed from the other open part 30B of the body 24 are connected with each other in a misaligned state (see the reference character X). In a worse case, a metal silicide formed from one open part 30A of each body 24 and a metal silicide formed from the other open part 308 of the body 24 are not connected with each other in a misaligned state (see the reference character Y). In the case where the buried bit lines 100 are farmed as indicated by the reference character X, the signal transfer characteristics (or low resistance characteristics) required by the semiconductor device may not be secured. In the case where the buried bit lines 100 are formed as indicated by the reference character Y, the buried bit lines 100 cannot perform their functions. Also, if the buried bit lines 100 are formed as indicated by the reference characters X and Y, since spaces for forming the source/drain regions and the channels of vertical channel transistors in pillars which are formed on the bodies 24 decrease, a problem is caused in that process margins for forming the source/drain regions and the channels of the vertical channel transistors decrease. For reference, the pillars are formed on the bodies 24, and the source/drain regions and the channels of the vertical channel transistors are formed in the pillars.

Hereinafter, a BSC process capable of solving a problem that is caused when the open parts are not uniformly defined, during the BSC process, and a method for fabricating the buried bit lines will be described in detail.

Figure 4:
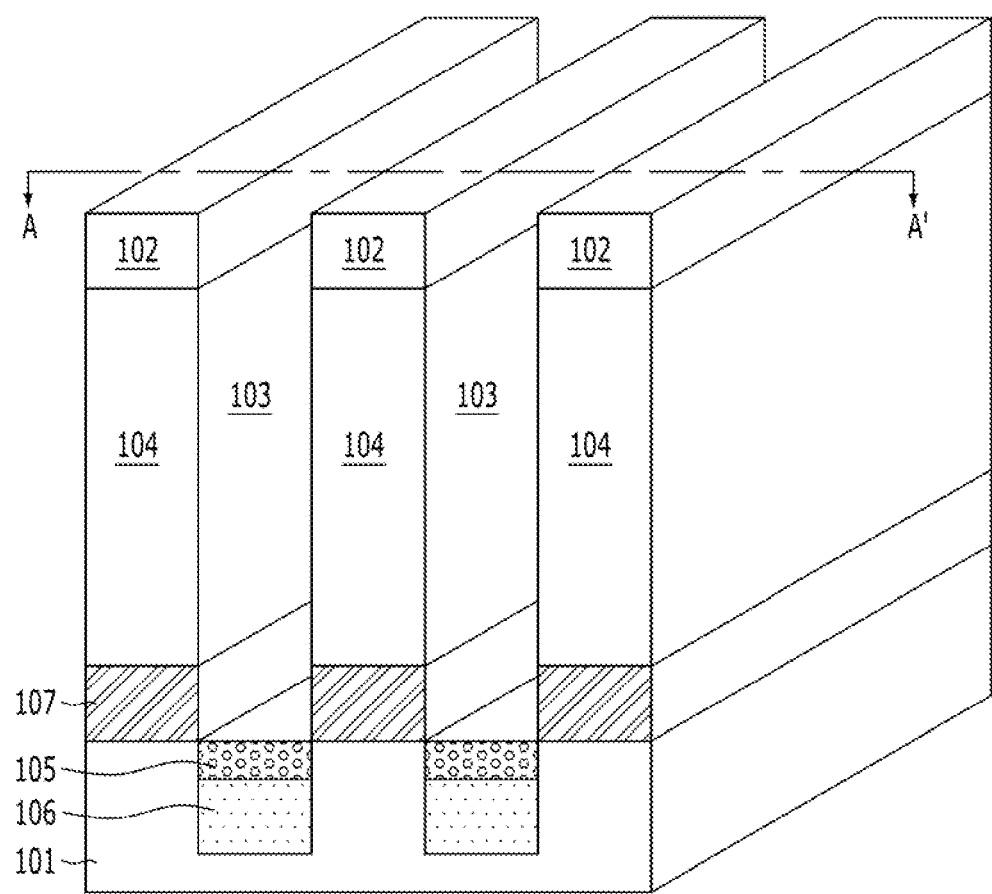
FIG. 4 is a view illustrating buried bit lines in accordance with an embodiment of the present invention.

FIG. 4 is a perspective view illustrating buried bit lines in accordance with an embodiment of the present invention.

Referring to FIG. 4, a plurality of bodies 104 are formed in a substrate 101 and are separated by a plurality of trenches 103 which are defined using hard mask patterns 102. The substrate 101 may be a semiconductor substrate and may include a monocrystalline silicon-containing substance. For example, the substrate 101 may include a silicon substrate, a silicon germanium substrate, or an SOI (silicon-on-insulator) substrate. The bodies 104, which are separated by the trenches 103, may have linear shapes that extend in one direction. Accordingly, each body 104 may have sidewalls that define the trenches 103.

Buried bit lines 107 may have linear shapes that extend in the same direction as the direction that the bodies 104 extend. The buried bit lines 107 may include a metallic layer. For example, the buried bit lines 107 may include a metal silicide. Since the metal silicide has a resistance that is lower than the resistance of a (poly)silicon layer doped with impurities, the buried bit lines 107 have low resistance. The buried bit lines 107 may be formed through a silicidation process. Further, the buried bit lines 107 may be formed through a full silicidation process. The full silicidation process is a process for fully silicidating a silicon-containing substance. The buried bit lines 107 may be formed using a near-noble metal, such as a titanium silicide ($TiSi_x$), a tungsten silicide ($WSi_x$), a cobalt silicide ($CoSi_x$), or a nickel silicide ($NiSi_x$). Alternatively, a refractory metal, such as a metal silicide may be used. The metal silicide may be obtained by forming a metal-containing layer through a sputtering process, a chemical vapor deposition (CVD) process or an atomic layer deposition (ALD) process and then performing a silicidation process.

The buried bit lines 107 are formed in the bodies 104 and are substantially co-planar with the bottoms of the trenches 103. That is, a lower surface of each of the buried bit lines 107 may be substantially co-planar with the bottoms of the trenches 103. That is, the lower surfaces of the buried bit lines 107 and the bottoms of the trenches 103 may be, positioned on a same plane. In this way, as the buried bit lines 107 are substantially co-planar with the bottoms of the trenches 103, it is possible to solve the problem that open parts for forming buried bit lines are not uniformly formed at the same position. This will be described in detail with reference to FIGS. 5A to 5I.

Reaction preventing regions 105, for preventing a silicidating reaction, are formed in the substrate 101 under the trenches 103. The reaction preventing regions 105 prevent the substrate 101 and a metal from reacting with each other to form metal silicides during a process for forming the buried bit lines 107, which include metal silicides. In other words, the reaction preventing regions 105 prevent adjacently buried bit lines 107 from short-circuiting with each other. Also, the reaction preventing regions 105 function to prevent a punch-through phenomenon from occurring between adjacent buried bit lines 107. The reaction preventing regions 105 may be impurity regions that are formed by ion-implanting an impurity into the substrate 101. As the impurity, any substances capable of preventing the reaction between the substrate 101 and a metal may be used. For instance, in the case where the substrate 101 includes a silicon-containing substance, fluorine (F) may be used as the impurity. Accordingly, the reaction preventing regions 105 may be silicon fluoride (SiF) regions.

Punch-through preventing regions 106 may be formed in the substrate 101 under the reaction preventing regions 105. The punch-through preventing regions 106, in cooperation with the reaction preventing regions 105, prevent punch-through between adjacent buried bit lines 107. The punch-through preventing regions 106 may be impurity regions that are formed by ion-implanting impurities into the substrate 101.

Since the buried bit lines 107, in accordance with the embodiment of the present invention, having the above-described structure, are substantially co-planar with the bottoms of the trenches 103, which separate the plurality of bodies 104, it is possible to solve the problem that open parts for forming buried bit lines of a BSC structure are not uniformly formed at the same position.

Furthermore, because the reaction preventing regions 105 are formed in the substrate 101 under the trenches 103, even though the buried bit lines 107 are substantially co-planar with the bottoms of the trenches 103, it is possible to prevent adjacent buried bit lines 107 from being short-circuited, and a punch-through phenomenon from occurring, while performing a process for forming the buried bit lines 107. Since the punch-through preventing regions 106 are formed under the reaction preventing regions 105, the punch-through phenomenon between adjacent buried bit lines 107 may be further effectively prevented.

FIGS. 5A to 5I are cross-sectional views showing the processes of a method for fabricating buried bit lines in accordance with another embodiment of the present invention. Herein, a method for fabricating buried bit lines having the structure shown in FIG. 4 will be exemplarily described. FIGS. 5A to 5I are taken along the line A-A' of FIG. 4.

Figure 5A:
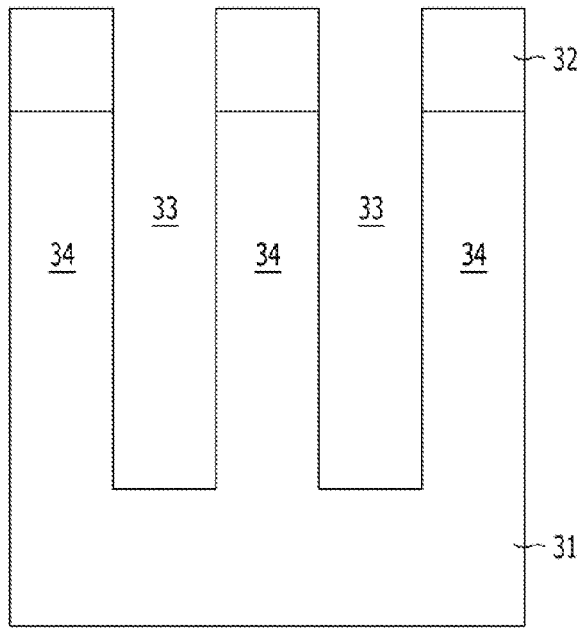
FIGS. 5A to 5I are views showing a method for fabricating buried bit lines in accordance with another embodiment of the present invention.

Referring to FIG. 5A, a substrate 311 prepared. A semiconductor substrate may be used as the substrate 31. The semiconductor substrate may include a monocrystalline silicon-containing substance. For example, the substrate 31 may include a silicon substrate, a silicon germanium substrate, or an SOI (silicon-on-insulator) substrate.

Hard mask patterns 32 are formed on the substrate 31. The hard mask patterns 32 may be formed of an oxide layer, a nitride layer, an oxynitride layer, a carbon-containing layer, a semiconductor layer, or a stack layer thereof. For example, the hard mask patterns 32 may be a stack layer in which a hard mask nitride layer and a hard mask oxide layer are stacked in that order. Also, the hard mask patterns 32 may be a stack layer in which a hard mask nitride layer, a hard mask oxide layer, a hard mask silicon oxynitride layer, and a hard mask carbon layer are stacked in that order.

The hard mask patterns 32 may be formed using a photoresist pattern (not shown). The hard mask patterns 32 are to form a plurality of bodies 34 in the substrate 31. The bodies 34 may be used in forming vertical channel transistors through subsequent processes. For example, vertical channel transistors may include source regions, drain regions, and channel regions. The channel regions may be positioned between the source regions and the drain regions and may be disposed in a direction perpendicular to the surface of the substrate 31. The vertical channel transistors have improved degree of integration and improved operational characteristics, and accordingly, may be applied to the memory cells of memory devices.

By etching the substrate 31 to a predetermined thickness, through using the hard mask patterns 32 as an etch mask, the plurality of bodies 34 are formed. An etching process for defining trenches 33 in the substrate 31 may include an anisotropic etching process. In the case where the substrate 31 is a silicon substrate, anisotropic etching may be performed using a chlorine-based gas, such as $Cl_2$ or $CCl_4$, a bromide-based gas, such as HBr, or a mixed gas including $O_2$.

The plurality of bodies 34 are separated from one another by the trenches 33 that are defined through the above-described process. The bodies 34 may have linear shapes that extend in a direction perpendicular to a surface of the substrate 31. Accordingly, each body 34 may have sidewalls that define the trenches 33 and that face adjacent bodies 34.

Figure 5B:
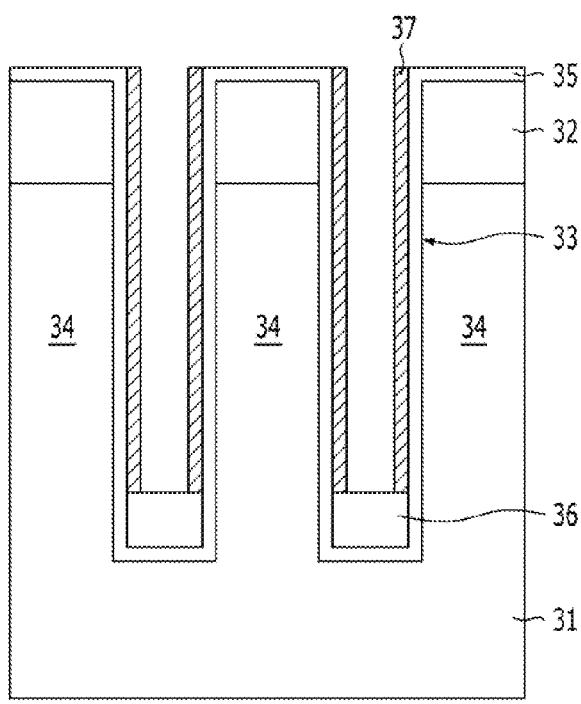

Referring to FIG. 5B, a first passivation layer 35 is formed on a surface, including the sidewalls, of the substrate that defines the trenches 33 and on a surface of the hard mask patterns 32. The first passivation layer 35 may be formed of a dielectric layer, such as an oxide layer or a nitride layer, a semiconductor layer, such as a silicon layer, a metal layer, such as a titanium (Ti) layer, cobalt (Co) layer, or an aluminum (Al) layer, or mixtures thereof (for example, a metal nitride layer). For instance, the first passivation layer 35 may be an oxide.

A sacrificial layer 36 is formed on the first passivation layer 35 to partially fill the trenches 33. The sacrificial layer 36 that partially fills the trenches 33 fills lower portions of the trenches 33. That is, the sacrificial layer 36 may be formed on the entire surface of the substrate 31 to fill the trenches 33. A blanket etching process, such as an etch-back process, may be performed, leaving the sacrificial layer 36 in the lower portions of the trenches 33. The sacrificial layer 36 has an etching selectivity that is higher than an etching selectivity of the first passivation layer 35. The sacrificial layer 36 may be formed of a dielectric layer, such as an oxide layer or a nitride layer, a semiconductor layer, such as a silicon layer, a metal layer, such as a titanium (Ti) layer, cobalt (Co) layer, or an aluminum (Al) layer, or mixtures thereof (for example, a metal nitride layer). For instance, in the case where the first passivation layer 35 is an oxide layer, the sacrificial layer 36 may be a polysilicon layer.

A second passivation layer 37 is formed on the side ails on the hard mask patterns 32, and on the sacrificial layer 36. Spacer etching is performed to remove the second passivation layer from the sacrificial layer 36, but leaving the second passivation layer 37 on the sidewalls of the bodies 34 and the hard mask patterns 32. The spacer etching may be performed using blanket etching. The second passivation layer 37 has an etching selectivity that is different than etching selectivities of the first passivation layer 35 and the sacrificial layer 36. The second passivation layer 37 may be formed of a dielectric layer, such as an oxide layer or a nitride layer, semiconductor layer, such as a silicon layer, a metal layer, such as titanium (Ti) layer, cobalt (Co) layer, or an aluminum (Al) layer, or mixtures thereof (for example, a metal nitride layer). For instance, in the case where the first passivation layer 35 and the sacrificial layer 36 are formed of an oxide and a polysilicon, respectively, the second passivation layer 37 may be formed of titanium nitride.

Figure 5C:
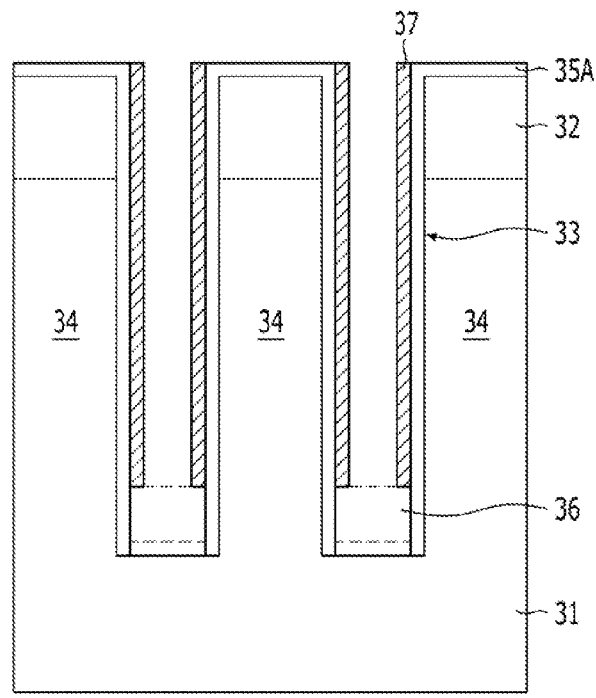

Referring to FIG. 5C, the sacrificial layer 36 is removed. The sacrificial layer 36 may be removed using dry etching or wet etching.

The first passivation layer 35 that is exposed due to removal of the sacrificial layer 36 is selectively removed. At this time, only the portions of the first passivation layer 35 that are formed on the bottoms of the trenches 33 are removed. Accordingly, the first passivation layer 35 remains on the sidewalls of the bodies 34. In order to selectively remove the portions of the first passivation layer 35 that are formed on the bottoms of the trenches 33, dry etching may be used. Hereinafter, the first passivation layer 35 will be designated by the reference numeral 35A.

The reason why only the portions of the first passivation layer 35A that are formed on the bottoms of the trenches 33 are removed is to prevent impurities from being implanted into the bodies 34 by scattering in a subsequent impurity ion implantation process. That is to say, the first passivation layer 35A that remains on the sidewalls of the bodies 34 serves as a barrier in the subsequent purity ion implantation process.

Figure 5D:
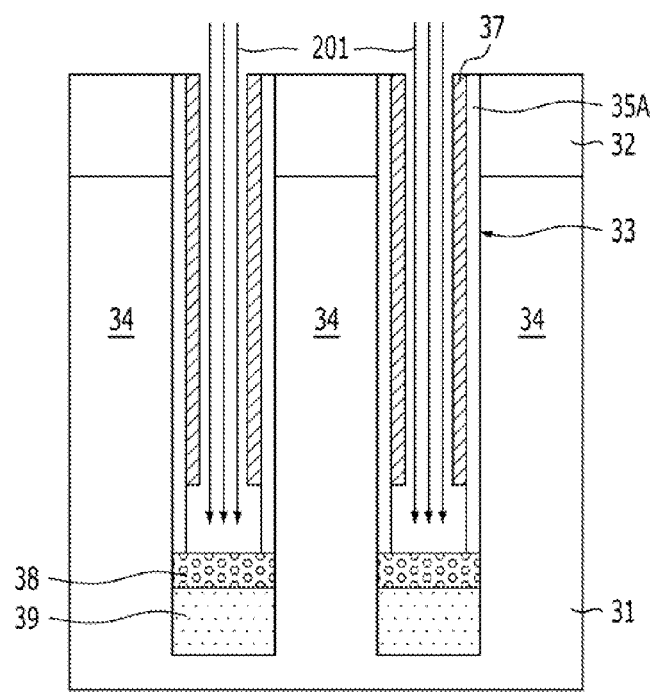

Referring to FIG. 5D, an impurity ion implantation process 201, for forming reaction preventing regions 38, is performed on the substrate 31 under the trenches 33. The reaction preventing regions 38 prevent metal silicides from being formed in the substrate 31, under the trenches 33, while a metal silicide forming process, for forming buried bit lines, is performed. In other words, the reaction preventing regions 38 serve as silicidation preventing regions. Furthermore, the reaction preventing regions 38 function to not only prevent a silicidation reaction, but also to prevent a punch-through phenomenon from occurring between adjacent buried bit lines. As an impurity for forming the reaction preventing regions 38, any substance capable of preventing a reaction between the substrate 31 and a metal, that is, all substances capable of preventing a silicidation reaction, may be used. For instance, in the case where the substrate 31 is a silicon substrate, fluorine (F) may be used as the impurity. Accordingly, the reaction preventing regions 38 may be silicon fluoride (SiF) regions.

After forming the reaction preventing regions 38, punch-through preventing regions 39 may be formed in the substrate 31 under the reaction preventing regions 38. The punch-through preventing regions 39, in cooperation with the reaction preventing regions 38, prevent punch-through between adjacent buried bit lines, The punch-through preventing regions 39 may be formed through an impurity on implantation process. An impurity may be selected depending upon the conductivity type of first source/drain regions, which will be formed through a subsequent process. For instance, in a case where the conductivity type of the first source/drain regions is an N-type, the punch-through preventing regions 39 may be formed as P-type impurity regions. The reason for this is that since the first source/drain regions surround buried bit lines, when the punch-through preventing regions 39 have a conductivity type complementary to the first source/drain regions, it is possible to effectively prevent, by junction isolation between the punch-through preventing regions 39 and the first source/drain regions, a punch-through phenomenon from occurring between adjacent buried bit lines.

Alternatively, the reaction preventing regions 38 may be formed after forming the punch-through preventing regions 39. The order of forming the reaction preventing regions 38 and the punch-through preventing regions 39 may be determined according to activation and diffusion degrees of impurities. Furthermore, in the case where characteristics (that is, punch-through preventing characteristics) may be sufficiently secured through the reaction preventing regions 38, the punch-through preventing regions 39 may not be formed.

Figure 5E:
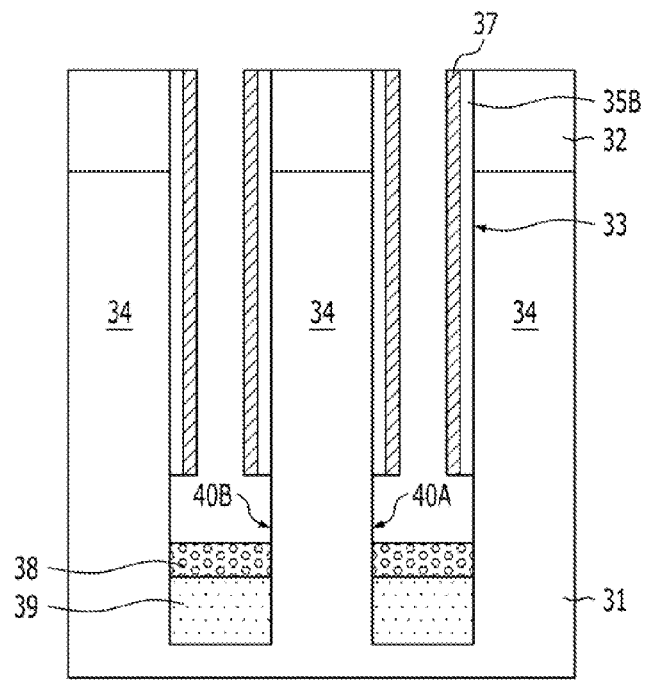

Referring to FIG. 5E, by etching the exposed portions of the first passivation layer 35A using the second passivation layer 37 as an etch mask, open parts 40A and 40B are defined to expose portions of both sidewalls of the bodies 34. The etching of the first passivation layer 35A for defining the open parts 40A and 408 may be performed through wet etching. While defining the open parts 40A and 40B, the portions of the first passivation layer 35A that are formed on the hard mask patterns 22 may be removed as well. Hereinafter, the first passivation layer 35A etched in this way will be designated by the reference numeral 358.

The open parts 40A and 40B are defined to be substantially co-planar with the bottoms of the trenches 33 and expose sidewalls of the lower portions of the bodies 34. As the open parts 40A and 408 are defined to be substantially co-planar with the bottoms of the trenches 33, it is possible to define the open parts 40A and 408 uniformly at the same position. Furthermore, the open parts 40A and 408 may have linear shapes that extend along the sidewalls of the bodies 34. The open parts 40A and 408 may be simultaneously defined on the sidewalls of the bodies 34.

Figure 5F:
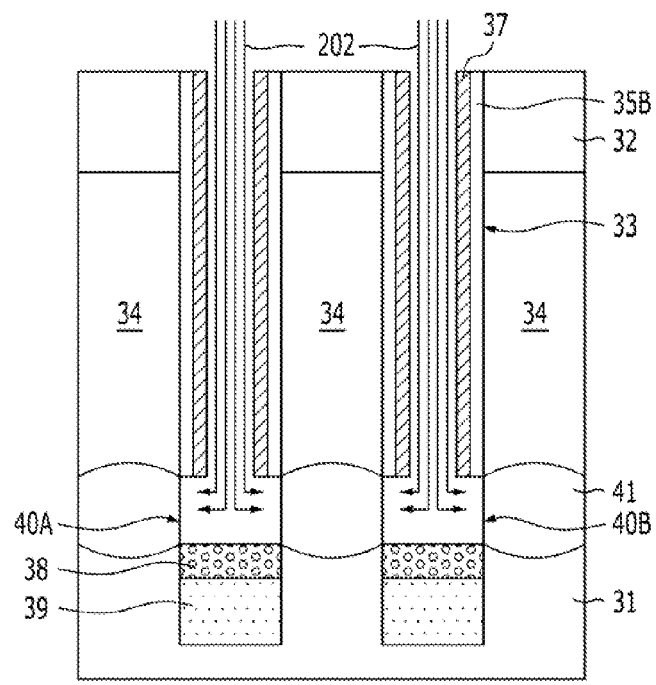

Referring to FIG. 5F, plasma doping 202 is performed. Any known plasma doping method may be used. As impurities are doped into the portions of the sidewalls, of the bodies 34, which are exposed by the open parts 40A and 408, first source/drain regions 41 are formed. The first source/drain regions 41 become the source regions or drain regions of vertical channel transistors.

The plasma doping 202 is performed using doping energy, a doping dose and a doping source. The doping source is a substance that contains a dopant to be doped to the first source/drain regions 41. For example, the doping source may include a dopant gas. The dopant gas may contain, for example, arsenic (As) or phosphorus (P). For example, the dopant gas may include $AsH_3$ or $PH_3$. Arsenic (As) and phosphorus (P) are known as N-type dopants. Also, as the doping source, a dopant gas containing boron (B) may be used. Boron is known as a P-type dopant. The doping energy is a bias voltage applied to the substrate 31. The doping energy is applied to the bodies 34 as well, and accordingly, the plasma doping 202 becomes possible in a lateral direction. Further, the plasma doping 202 in the lateral direction is possible by impingement of ions in the excited plasma. The doping dose indicates an implantation amount of the dopant. The doping dose is set to from approximately $1 \times 10^{15}$ to approximately $1 \times 10^{17}$ atoms/cm$^2$. By performing the plasma doping 202 using the doping dose with such a range, the dopant doped to the first source/drain regions 41 has a doping concentration equal to or greater than approximately $1 \times 10^{20}$ atoms/cm$^3$. For the plasma doping 202, a gas for exciting plasma may be flowed. The gas for exciting plasma may include, for example, argon (Ar) or helium (He).

As described above, since the plasma doping 202 may be performed without a tilt angle, doping is possible without experiencing a shadow effect by a surrounding structure. Due to this fact, the first source/drain regions 41 may be formed at desired positions. Furthermore, by controlling the doping energy, the first source/drain regions 41 may be simultaneously formed through both open parts 40A and 40B. Accordingly, the first source/drain regions 41, which are simultaneously formed through both open parts 40A and 40B, may be connected with each other and may become one region.

As another method for forming the first source/drain regions 41, doped polysilicon, formed via in situ doping, may be used. For example, by performing annealing after filling the doped polysilicon in the trenches 33, the dopant in the doped polysilicon may be diffused into the bodies 34.

Figure 5G:
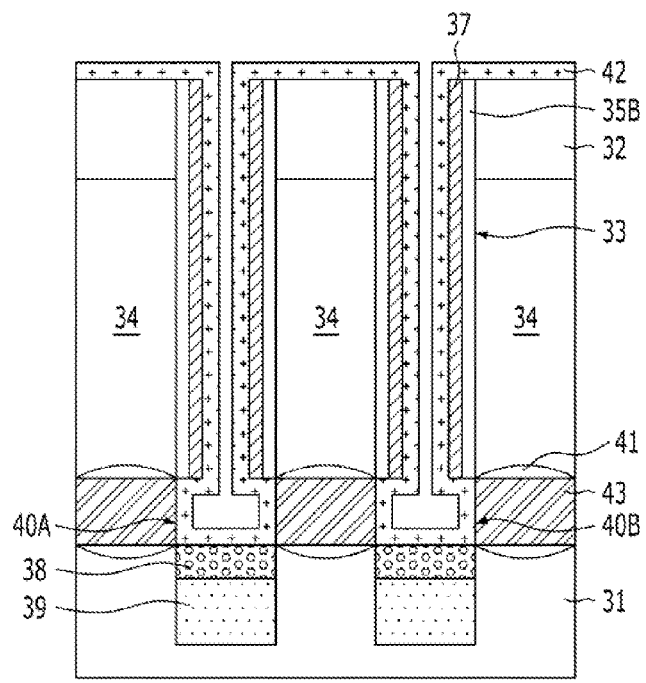

Referring to FIG. 5G, a conductive layer is formed on the surface of the hard mask patterns 32, the second passivation layer 37, the first source/drain regions 41, and the reaction preventing regions 38. The conductive layer includes a metal-containing layer 42. The metal-containing layer 42 includes a metal-containing substance capable of silicidation. For example, the metal-containing layer 42 includes any one of cobalt (Co) titanium (Ti), tantalum (Ta), nickel (Ni), tungsten (W), platinum (Pt), or palladium (Pd). The metal-containing layer 42 may be formed using chemical vapor deposition (CVD) or atomic layer deposition (ALD).

By performing annealing, silicidation is affected in which the metal-containing layer 42 and the bodies 34 react with each other. Since the material of the bodies 34 contains silicon, metal silicides 43 are formed by the reaction of the meta containing layer 42 and the bodies 34. The metal silicides 43 may include any one of a cobalt silicide, a titanium silicide, a tantalum silicide, a nickel silicide, a tungsten silicide, a platinum silicide, or a palladium silicide.

The annealing for forming the metal silicides 43 may be rapid thermal annealing (RTA). The rapid thermal annealing (RTA) may be performed at different temperatures according to the kinds (or the materials) of the bodies 34 and the metal-containing layer 42. For example, in the case where the metal-containing layer 42 is formed using cobalt (Co), an annealing temperature range may be approximately 400° C. to approximately 800° C. The metal silicides 43 may be formed to have a fully silicidated (FUSI) structure. That is to say, by sufficiently performing silicidation, a full thickness of the bodies 34 may be silicidated. Through full silicidation, the metal silicides 43 are formed in the bodies 34.

The metal silicides 43, which are formed through the silicidation process to be buried in the bodies 34 as described above, become buried bit lines (BBL). Hereinafter, the metal silicides 43 will be referred to as buried bit lines 43.

When forming, via annealing the buried bit lines 43 in the bodies 34, no metal silicides are formed in the substrate 31 under the trenches 33 due to the presence of the reaction preventing regions 38 that are formed in the substrate 31 under the trenches 33. Thus, it is possible to prevent the occurrence of a short circuit between the buried bit lines 43 while performing the process for forming the buried bit lines 43.

Figure 5H:
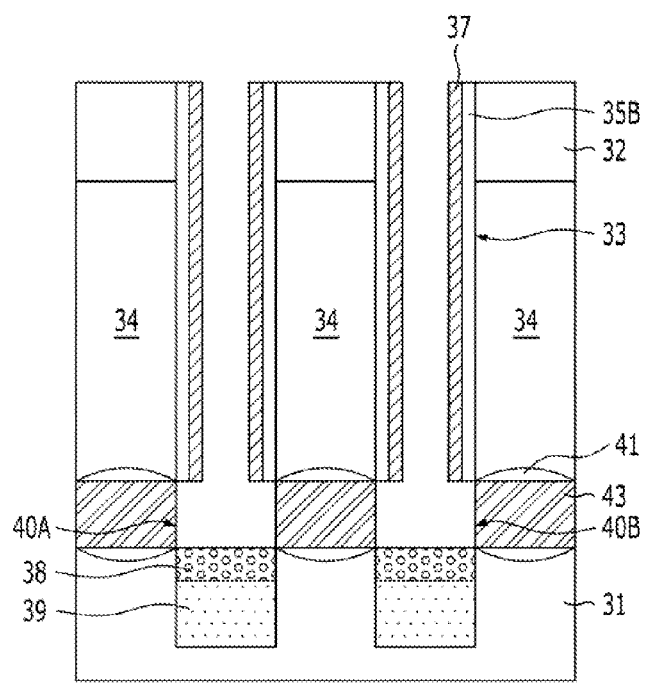

Referring to FIG. 5H, the unreacted metal-containing layer 42 which remains after the metal silicides are formed is removed. The unreacted metal-containing layer 42 may be removed through wet etching.

Meanwhile, in the case where the metal-containing layer 42 is formed using cobalt, in order to form a cobalt silicide, rapid thermal annealing (RTA) is performed at least twice. For example, primary annealing and secondary annealing are performed. The primary annealing is performed at a temperature of approximately 400° C. to approximately 600° C., and the secondary annealing is performed at a temperature of approximately 600° C. to approximately 800° C. By the primary annealing, a cobalt silicide with the phase of $CoSi_x$ (x=approximately 0.1 to approximately 1.5) is formed. By the secondary annealing, a cobalt silicide with the phase of $CoSi_2$ is obtained. Among cobalt silicides, the cobalt silicide with the phase of $CoSi_2$ has the smallest specific resistance. Unreacted cobalt is removed between the primary annealing and the secondary annealing. The unreacted cobalt may be removed using a mixed chemical of sulphuric acid ($H_2SO_4$) and hydrogen peroxide ($H_2O_2$).

Figure 5I:
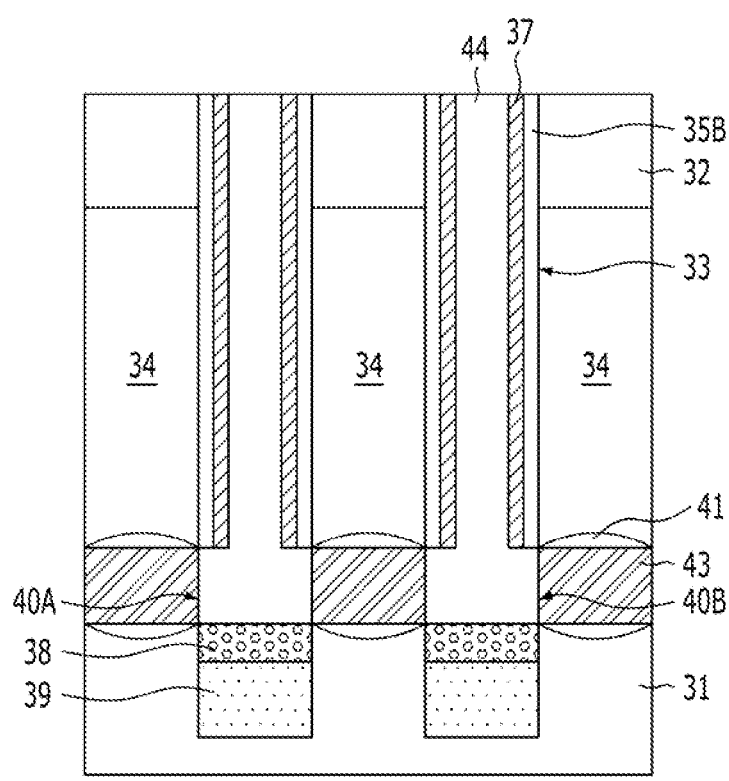

Referring to FIG. 5I, an interlayer dielectric layer 44 is formed to fill the trenches 33. The interlayer dielectric layer 44 may include an oxide such as BPSG. The interlayer dielectric layer 44 may be pianarized such that the surfaces of the hard mask patterns 22 are exposed.

The buried bit lines 43 in accordance with the embodiment of the present invention may be formed through the above-described processing procedure. In the buried bit lines 43 in accordance with the embodiment of the present invention, since the open parts 40A and 40B are defined to be defined to be substantially co-planar with the bottoms of the trenches 33, the open parts 40A and 40B may be defined uniformly at the same position, whereby the characteristics of the buried bit lines 43 may be improved. Moreover, since the process for defining the open parts 40A and 406, that is, the BSC process is simple, the productivity and the reproducibility may be improved.

In addition, by forming the reaction preventing regions 38 in the substrate 31 under the trenches 33, it is possible to prevent adjacent buried bit lines 43 from being short-circuited and a punch-through phenomenon from occurring. By forming the punch-through preventing regions 39 under the reaction preventing regions 38, the punch-through between adjacent buried bit lines 43 may be effectively prevented.

Figure 6A:
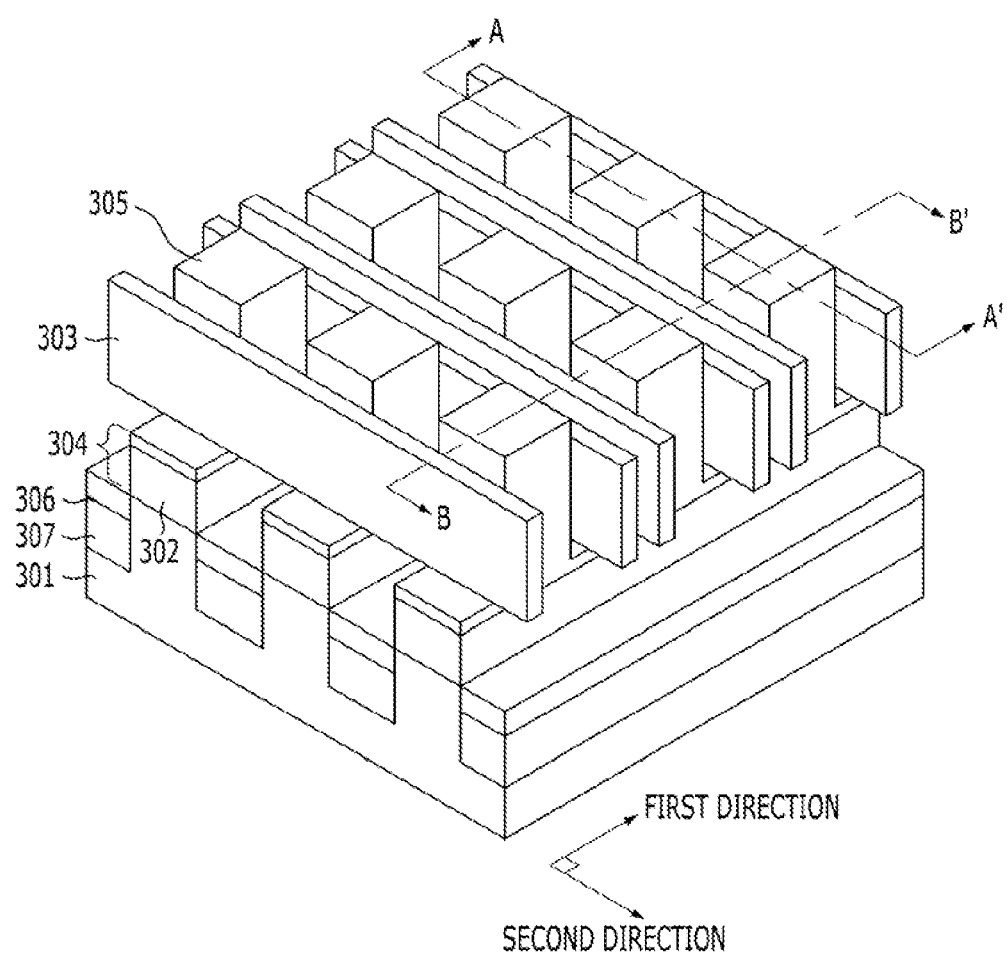
FIGS. 6A to 6C are views showing a semiconductor device with buried bit lines in accordance with another embodiment of the present invention.
Figure 6B:
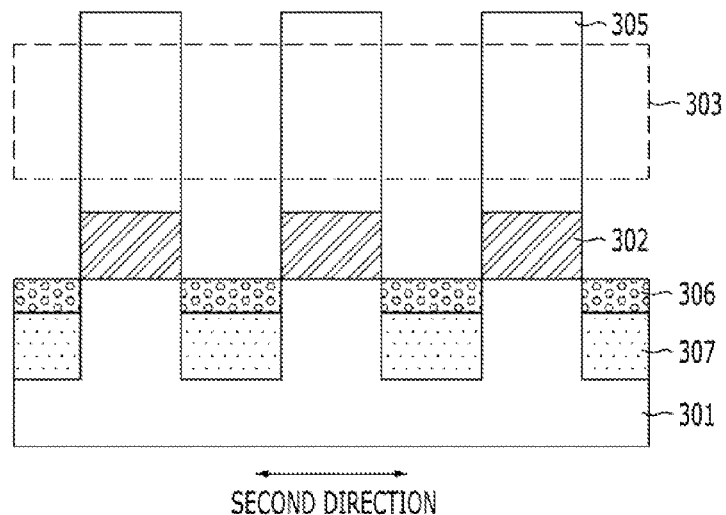
Figure 6C:
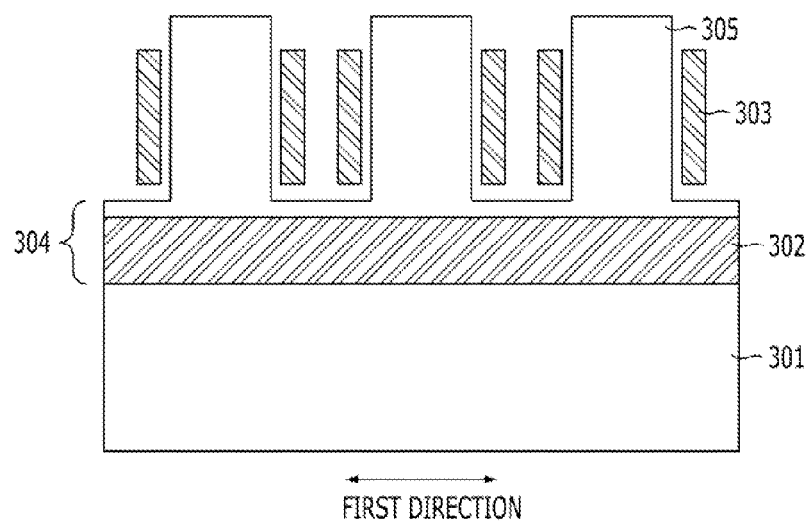

FIGS. 6A to 6C are views showing a semiconductor device with buried bit lines in accordance with another embodiment of the present invention. FIG. 6A is a perspective view, and FIGS. 66 and 6C are cross-sectional views respectively taken along the lines A-A' and B-B' of FIG. 6A.

Referring to FIGS. 6A to 6C, a semiconductor device includes a plurality of bodies 304 that are formed on a substrate 301, buried bit lines 302 that are formed in the bodies 304, reaction preventing regions 306 that are formed in the substrate 301 between the buried bit lines 302, punch-through preventing regions 307 that are formed in the substrate 301 under the reaction preventing regions 306, and a plurality of pillars 305 and a plurality of word lines 303 that are formed on the bodies 304. The bodies 304 and the pillars 305 are active structures.

The substrate 301, the bodies 304 and the pillars 305 may be provided integrally with one another and may be distinguished from one another by etching a silicon-containing substance. The plurality of pillars 305 are formed on the respective bodies 304. That is to say, a plurality of pillars 305 are formed on each body 304. The plurality of bodies 304 have linear shapes which extend in a first direction on the substrate 301, and are separated from one another by trenches (see the reference numeral 103 of FIG. 4) in a second direction. The bodies 304 are formed in a second direction perpendicular to the first direction, and the pillars 305 are formed on the bodies 304, in the second direction. For example, the substrate 301 and the bodies 304 may be orthogonal to each other, and the bodies 304 and the pillars 305 may be orthogonal to each other. The plurality of pillars 305 are formed on the bodies 304 to be separated from one another. The plurality of pillars 305 may have a matrix type array layout.

The substrate 301 may include a monocrystalline silicon-containing substance. For example, the substrate 301 may include a silicon substrate, a silicon germanium substrate, or an SOI (silicon-on-insulator) substrate. Because the bodies 304, the pillars 305 and the substrate 301 may include the same substance, the bodies 304 and the pillars 305 may include a silicon-containing substance. In other words, the bodies 304 and the pillars 305 include silicon or silicon germanium.

Each pillar 305 has a structure in which the source/drain in regions and the channel region of a vertical channel transistor are formed. For example, each pillar 305 may include a first source/drain region, a second source/drain region, and a vertical channel region. Any one of the first source/drain region and the second source/drain region may be connected with each buried bit line 302. The other of the first source/drain region and the second source/drain region may be connected with a capacitor. The first source/drain region, the vertical channel region, and the second source/drain region may be connected with one another in the second direction. The first source/drain region and the second source/drain region may form an NPN junction or a PNP junction with the vertical channel region. For example, in the case where the first source/drain region and the second source/drain region are doped with impurities of a first conductivity type, the vertical channel region may be doped with impurities of a second conductivity type opposite to the first conductivity type. As is well known in the art, when the impurities of the first conductivity type are N-type impurities, the impurities of the second conductivity type include P-type impurities. Conversely, when the impurities of the first conductivity type are P-type impurities, the impurities of the second conductivity type include N-type impurities. In the event that the vertical channel transistor is an NMOSFET, the first source/drain region, the vertical channel region and the second source/drain region may form an NPN junction.

The buried bit lines 302 are formed in the bodies 304, and may extend in a direction in which the bodies 304 extend, that is, in the first direction. The buried bit lines 302 may include a metallic substance, such as a metal silicide. The metal silicide has a resistance that is lower than that of doped (poly)silicon. Thus, the buried bit lines 302 have low resistance. The buried bit lines 302 may be formed through a silicidation process. Further, the buried bit lines 302 may be formed through a full silicidation process. The full silicidation process is a process for fully silicidating a silicon-containing substance. The buried bit lines 302 may be formed using a near-noble metal, such as a titanium silicide (TiSi$_x$), a tungsten silicide (WSI$_x$), a cobalt silicide (CoSi$_x$), or a nickel silicide (NiS$_x$). Alternatively, a refractory metal, such as a metal silicide may be used. The metal silicide may be obtained by forming a metal-containing layer through a sputtering process, a chemical vapor deposition (CUD) process or an atomic layer deposition (ALD) process and then performing a silicidation process. Adjacent buried bit lines 302 are separated by the trenches (see the reference numeral 103 of FIG. 4). While not shown in a drawing, a dielectric layer may be filled in the trenches between adjacent buried bit lines 302.

The buried bit lines 302 are formed in the bodies 304 while being aligned on the surface of the substrate 301. In detail, the buried bit lines 302 may have lower surfaces of the buried bit lines 302 are substantially co-planar with the upper surface of the substrate 301. In this way, it is possible to solve the problem that is caused when open parts, formed during a BSC process for forming buried bit lines, are not uniformly formed at the same position.

The reaction preventing regions 306 for preventing a silicidation reaction from occurring are formed in the substrate 301 between the buried bit lines 302. The reaction preventing regions 306 prevent the substrate 301 and a metal from reacting, during the process for forming the buried bit lines 302 including the metal silicides, with each other to form the metal silicides. That is, the reaction preventing regions 306 prevent the buried bit lines 302 from being short-circuited. Furthermore, the reaction preventing regions 306 prevent punch-through between adjacent buried bit lines 302. The reaction preventing regions 306 may be formed by implanting impurity ions into the substrate 301. As an impurity, any substance capable of preventing the substrate 301 and a metal from reacting with each other may be used. For instance, in the case where the substrate 301 includes a silicon-containing substance, fluorine (F) may be used as the impurity. Accordingly, the reaction preventing regions 306 may be silicon fluoride (SiF) regions.

The punch-through preventing regions 307 may be formed in the substrate 301 under the reaction preventing regions 306. The punch-through preventing regions 307 function, in cooperation with the reaction preventing regions 306, to prevent punch-through between adjacent buried bit lines 302. The punch-through preventing regions 307 may be impurity regions that are formed by ion-implanting impurities into the substrate 301.

The word lines 303 are formed on the sidewalls of the pillars 305 and extend vertically in the second direction. Thus, the word lines 303 are referred to as vertical word lines. Since the word lines 303 are formed on both sidewalls of the pillars 305, a double word line structure may be formed. Even though the double word line structure is formed, ends of the respective word lines may be connected with each other. Since the pillars 305 include channel regions, vertical channels are formed by the word lines 303. Thus, vertical channel transistors, each including a first source/drain, a vertical channel, and a second source/drain are formed. The word lines 303 may extend in a third perpendicular to the first direction (the extending direction of the buried bit lines 302). The word lines 303 include a metallic substance. For example, the word lines 303 may include a titanium nitride (TiN) or a stack of a tungsten nitride and tungsten (WN/W). The word lines 303 and the buried bit lines 302 may be formed to be separated from each other. To this end, a dielectric substance may be additionally formed between the word lines 303 and the buried bit lines 302. The dielectric substance may include a silicon oxide, etc.

As described above, as the buried bit lines 302 are formed in the bodies 304, the parasitic capacitance ($C_B$) between adjacent buried bit lines 302 may be reduced.

Also, since the lower surfaces of the buried bit lines 302 are substantially co-planar with the surface of the substrate 301, it is possible to solve the problem that is caused when open parts in the buried bit lines of a BSC structure are not uniformly formed at the same position.

Moreover, since the reaction preventing regions 306 are formed, it is possible to prevent the buried bit lines 302 from being short-circuited in the process for forming the buried bit lines 302 and a punch-through phenomenon from occurring.

Furthermore, since the punch-through preventing regions 307 are formed under the reaction preventing regions 306, it is possible to effectively prevent the punch-through between adjacent buried bit lines 302.

Figure 7A:
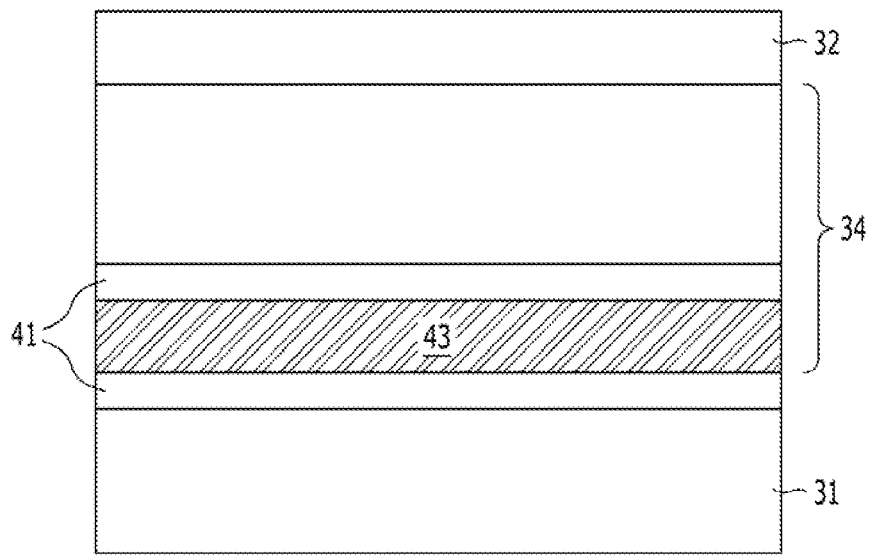
FIGS. 7A to 7F are views showing a method for fabricating a semiconductor device with buried bit lines in accordance with another embodiment of the present invention.

FIGS. 7A to 7F are cross-sectional views showing the processes of a method for fabricating a semiconductor device with buried bit lines in accordance with another embodiment of the present invention. Herein, the method for fabricating a semiconductor device with buried bit lines will be exemplarily described in succession to the method for fabricating buried bit lines shown in FIGS. 5A to 5I. FIGS. 7A to 7F are cross-sectional views taken along the line B-B' of FIG. 6A, FIG. 7A is a cross-sectional view taken along the line B-B' of FIG. 6A for the structure shown in FIG. 5I.

Referring to FIG. 7A, the buried bit lines 43 are formed through the BSC process to extend in a first direction. The buried bit lines 43 may be formed in the first source/drain regions 41 that are formed in the bodies 34.

Figure 7B:
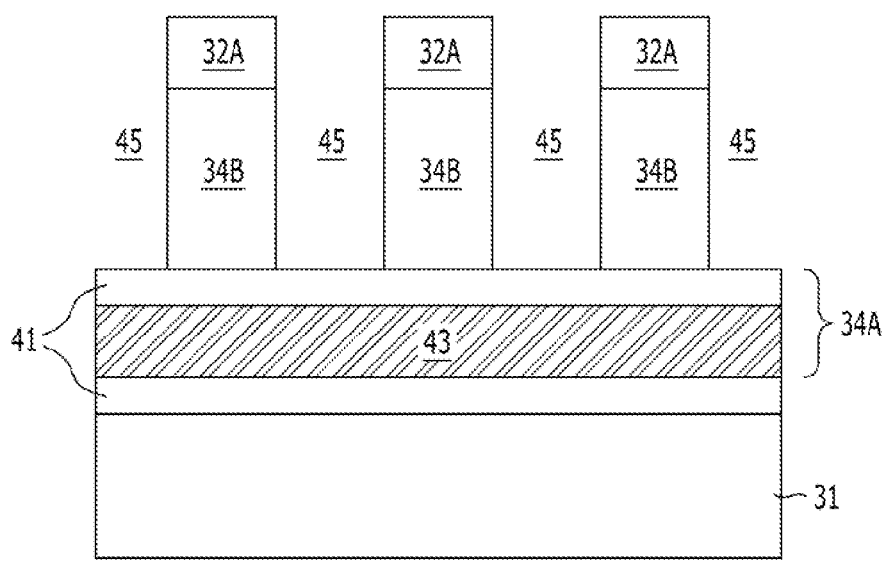

Referring to FIG. 7B, word line trenches 45 are defined. A photoresist pattern (not shown) is used for defining the word line trenches 45. The hard mask patterns 32 are etched using the photoresist pattern as an etch mask. Successively, the upper portions of the bodies 34 are etched by a predefined depth. While not shown in the cross-sectional view taken along the line B-B' of FIG. 6A, the interlayer dielectric layer 44 (see FIG. 5I) may be etched by the predefined depth as well. Hereinafter, the etched hard mask patterns 32 and bodies 34 will be respectively designated by the reference numerals 32A and 34A.

By etching the upper portions of the bodies 34 in this way, a plurality of pillars 34B are formed on the bodies 34A. The bodies 34A and the pillars 34B become active structures. The bodies 34A are separated by the trenches 33 and have linear forms that extend in the first direction. The pillars 34B have structures that vertically extend in a direction perpendicular to from the bodies 34A. The pillars 348 are form a cell unit. Accordingly, a plurality of pillars 34B are formed on one body 34A and are separated from one another by the word line trenches 45. The word line trenches 45 may have a depth that does not expose the buried bit lines 43.

The pillars 34B have structures in which the source/drain regions and the channel regions of vertical channel transistors are formed. The plurality of pillars 34B may have the layout of a matrix type array on the bodies 34A.

Figure 7C:
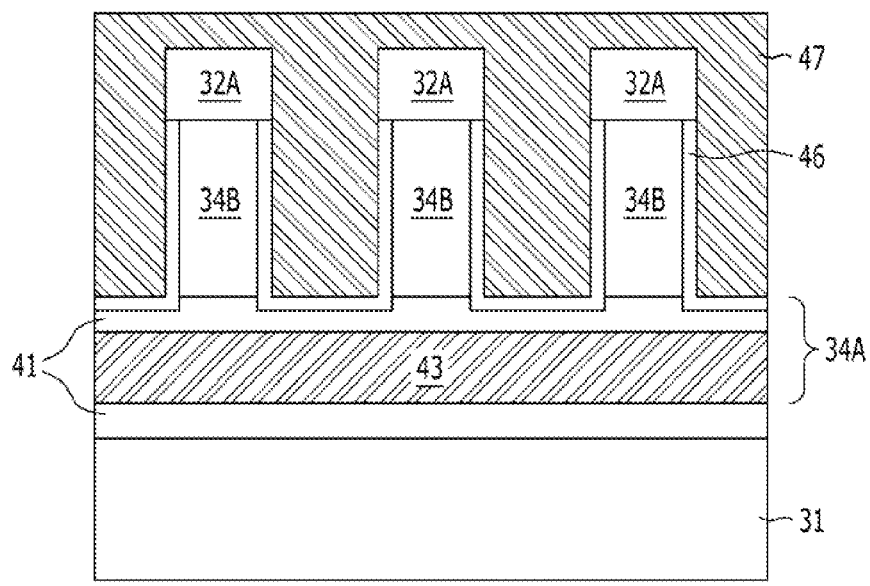

Referring to FIG. 7C, a gate dielectric layer 46 is formed on the exposed surfaces of the bodies 34A and the pillars 34B. The gate dielectric layer 46 may be formed by oxidating the sidewalls of the pillars 34B and the upper surfaces of the bodies 34A. The oxidation process may be performed using thermal oxidation.

A conductive layer 47 is formed to fill the word line trenches 45. The conductive layer 47 uses a low resistance substance, such as a metallic material, including titanium, titanium nitride, or tungsten.

Figure 7D:
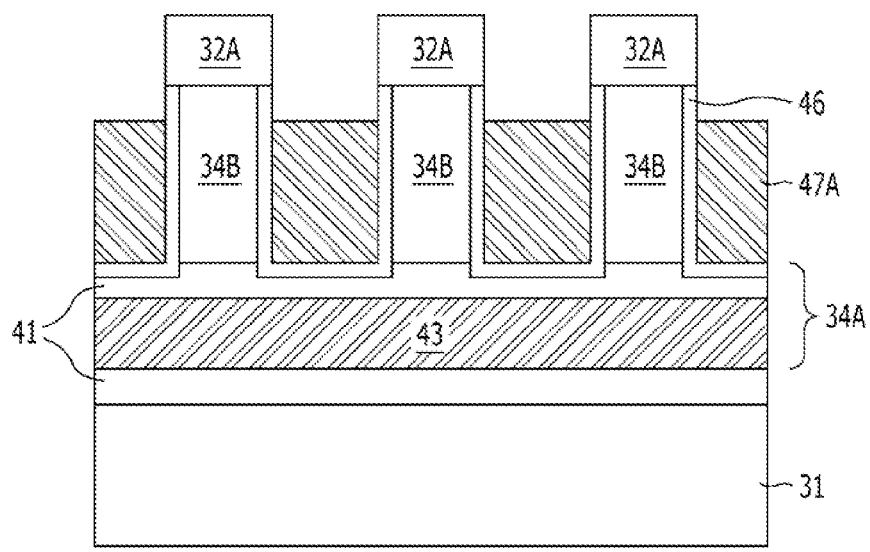

Referring to FIG. 7D, planarization and blanket etching (for example, etch-back) are sequentially performed on the conductive layer 47. A planarization process may be performed using chemical mechanical polishing (CMP). The planarization process may be performed until the hard mask patterns 32A are exposed. The blanket etching is performed after the planarization. During the blanket etching, an etching amount for the conductive layer 47 may be controlled according to a predetermined channel length. Hereinafter, the etched conductive layer 47 will be designated by the reference numeral 47A.

Figure 7E:
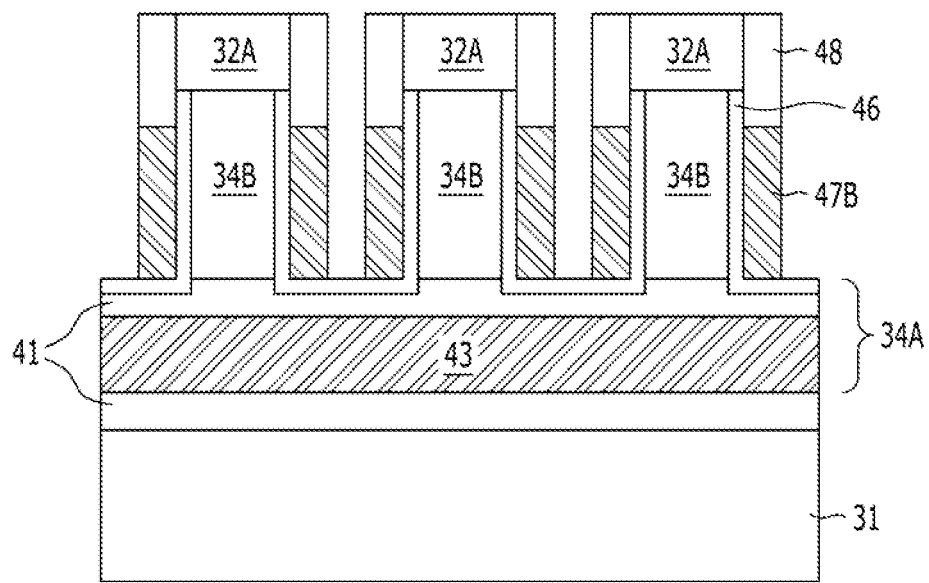

Referring to FIG. 7E, spacers 48 are formed by depositing a dielectric layer on the surface of the structure including the conductive layer 47A, the hard mask patterns 32A, and the dielectric layer 46, and then performing blanket etching (for example, etch-back). The spacers 48 may be formed of an oxide, a nitride, or an oxynitride.

The conductive layer 47A is etched using the spacers 48 as an etch mask to form vertical word lines 476 on the sidewalls of the pillars 346. The vertical word lines 47B also serve as vertical gate electrodes. In a variation for the vertical word lines 478, the vertical word lines 478 may be formed to surround the pillars 348. In another variation, after forming annular vertical gate electrodes surrounding the pillars 348, vertical word lines 476 may be formed in such a way as to connect adjacent vertical gate electrodes with each other. The vertical word lines 478 may be formed to extend in a direction crossing with the buried bit lines 43.

Figure 7F:
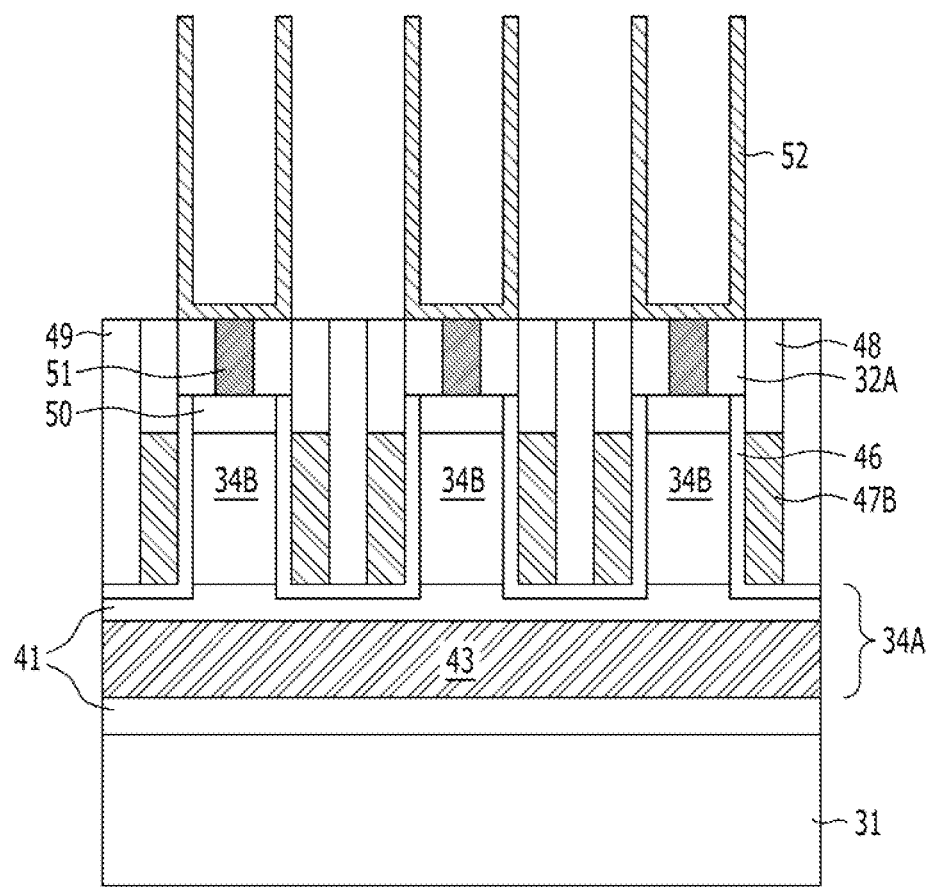

Referring to FIG. 7F, a word line isolation layer 49 for isolating the vertical word lines 476 from one another is formed. The word line isolation layer 49 may include a dielectric layer. The word line isolation layer 49 may be formed by forming a dielectric layer on the entire structure formed with the vertical word lines 476 and then performing planarization until the hard mask patterns 32A are exposed.

By performing storage node contact etching, the upper surfaces of the pillars 346 are exposed. Thereafter, storage node contact (SNC) plugs 51 are formed. Before forming the storage node contact plugs 51, second source/drain regions 50 may be formed in the upper portions of the pillars 34B by performing ion implantation. The second source/drain regions 50 may be formed by using an ion implantation method generally known in the art. Accordingly, the pillars 346 may include the second source/drain regions 50 and vertical channel regions. The vertical channel regions are formed between the first source/drain regions 41 and the second source/drain regions 50. The second source/drain regions 50 may be connected with capacitors. The first source/drain regions 41, the vertical channel regions and the second source/drain regions 50 may be connected with one another in the vertical direction. The first source/drain regions 41 and the second source/drain regions 50 may form NPN junctions or PNP junctions in cooperation with the vertical channel regions. For example, in the case where the first source/drain regions 41 and the second source/drain regions 50 are doped with an impurity of a first conductivity type, the vertical channel regions may be doped with an impurity of a second conductivity type that is opposite to the first conductivity type. As is well known in the art, when the impurity of the first conductivity type is an N-type impurity, the impurity of the second conductivity type is a P type impurity. Conversely, when the impurity of the first conductivity type is a P-type impurity, the impurity of the second conductivity type is a N-type impurity. When the vertical channel transistors are NMOSFETs, the first source/drain regions 41, the vertical channel regions, and the second source/drain regions 50 may form NPN junctions.

Capacitors are formed on the storage node contact plugs 51. The capacitors include storage nodes 52. The storage nodes 52 may have the shapes of cylinders. In another embodiment, the storage nodes 52 may have the shapes of pillars or concaves. While not shown in a drawing, a dielectric layer and top electrodes are subsequently formed.

A semiconductor device having the buried bit lines 43 may be formed through the above-described processing procedure. While a method for forming vertical channel transistors with the buried bit lines 43 and capacitors has been described, the semiconductor device may be completed by performing a subsequent process for forming metal lines, etc. according to a method generally known in the art.

The buried bit lines and the semiconductor device having the same in accordance with the embodiments of the present invention may be included in a memory cell and a memory cell array. The buried bit lines and word lines may store or output data on the basis of voltages applied by a column decoder and a row decoder that are connected with the memory cell array.

The memory cell array according to the embodiment of the present invention may be included in a memory device. The memory device may include a memory cell array, a row decoder, a column decoder and sense amplifiers. The row decoder selects a word line corresponding to a memory cell for which a read operation or a write operation is to be performed, among the word lines of the memory cell array, and outputs a word line select signal to the memory cell array. The column decoder selects a bit line corresponding to a memory cell for which a read operation or a write operation is to be performed, among the bit lines of the memory cell array, and outputs a bit line select signal to the memory cell array. The sense amplifiers sense the data stored in the memory cells that are selected by the row decoder and the column decoder.

The memory device according to the embodiment of the present invention may be applied to a DRAM (dynamic random access memory). The memory device is not limited to the DRAM and may be applied to various memories, such as an SRAM (static random access memory), a flash memory, an FeRAM (ferroelectric random access memory), an MRAM (magnetic random access memory), or a PRAM (phase change random access memory).

The main product groups of the memory device may be applied not only to computing memories used in a desktop computer, a notebook computer and a server but also to graphics memories of various specifications and mobile memories which recently gain popularities with the development of mobile communication. Also, the memory device may be provided not only in a portable storage medium such as a memory stick, an MMC, an SD, a CF, an xD picture card, or a USB flash device but also in various digital applications such as an MP3P, a PMP, a digital camera, a camcorder, or a mobile phone. Furthermore, the memory device may be applied not only to a single semiconductor device but also to technical fields including an MCP (multi-chip package), a DOC (disk on chip), or an embedded device. Moreover, the memory device may be applied to a CIS (CMOS image sensor) and may be provided in various fields such as of a camera phone, a web camera and a small photographing device for a medical use.

The memory device according to the embodiment of the present invention may be used in a memory module. The memory module includes a plurality of memory devices mounted to a module substrate, a command link configured to allow the memory device to receive control signals (an address signal, a command signal and a clock signal) from an external controller, and a data link connected with the memory devices and configured to transmit data. The command link and the data link may be formed similarly to those used in a general semiconductor module. In addition, the material and the structure of the module substrate are not specifically limited.

The memory module according to the embodiment of the present invention may be used in a memory system. The memory system includes a controller which provides a bidirectional interface between at least one memory module to which a plurality of memory devices are mounted and an external system and is configured to control the operation of the memory module.

The memory system according to the embodiment of the present invention may be used in an electronic unit. The electronic unit includes a memory system and a processor electrically connected therewith. The processor may include a CPU (central processing unit) an MPU (micro processor unit), an MCU (micro controller unit), a GPU (graphics processing unit), or a DSP (digital signal processor). The CPU or MPU may have a combined form of an ALU (arithmetic logic unit) as an arithmetic logic operation unit and a CU (control unit) for reading and analyzing a command and controlling respective units. When the processor is the CPU or the MPU, the electronic unit may include a computer instrument or a mobile instrument. The GPU as a CPU for graphics is a processor for calculating numbers with decimal points and showing graphics in real time. When the processor is the GPU, the electronic unit may include a graphic instrument. The DSP is a processor for converting an analog signal (for example, voice) into a digital signal at a high speed and using a calculation result or converting a digital signal into an analog signal. The DSP mainly calculates digital values. When the processor is the DSP, the electronic unit may include a sound and image instrument. Besides, the processor include an APU (accelerate processor unit) being a processor that has a combined form of CPU and GPU and includes the role of a graphic card.

As is apparent form the above descriptions, according to the embodiments of the present invention, since buried bit lines which are brought into direct contact with lower portions of pillars are formed through a BSC (both-side-contact) process and a full silicidation process, parasitic capacitance between adjacent buried bit lines may be reduced.

Furthermore, because a metal suicide is adopted as the material of the buried bit lines, the sheet resistance (Rs) of the buried bit lines may be decreased.

Moreover, due to the fact that bottom surfaces the buried bit lines are substantially co-planar with the bottoms of the trenches, problems that are otherwise caused when open parts are not uniformly defined in buried bit lines with a BSC structure may be solved.

In addition, since a silicidation preventing region is formed in a substrate between buried bit lines, it is possible to prevent a short circuit from occurring between the buried bit lines even though the buried bit lines containing a metal silicide are substantially co-planar with the bottoms of the trenches, and it is possible to prevent a punch-through phenomenon from occurring between adjacent buried bit lines.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    etching a substrate to form a plurality of bodies, having sidewalls, separated by a plurality of trenches, where each trench, of the plurality of trenches is defined by a pair of sidewalls of corresponding ones of the plurality of bodies;
    forming, in the substrate under each trench, of the plurality of trenches, silicidation preventing regions; and
    performing a silicidation process on the sidewalls of the plurality of bodies to form buried bit lines in each body, of the plurality of bodies, where lower surfaces of the buried bit lines are substantially co-planar with bottoms of the plurality of trenches.

2. The method of claim 1, wherein the silicidation preventing regions are to prevent metal silicides from being formed in the substrate during a silicidation process.

3. The method of claim 1, further comprising:
    forming punch-through preventing regions in the substrate under the silicidation preventing regions before forming the buried bit lines.

4. The method of claim 1, wherein forming the buried bit lines further comprises:
    forming a passivation layer on the pair of sidewalls before forming the silicidation preventing regions;
    removing portions of the passivation layer that are adjacent to a bottom of each trench, of the plurality of trenches, after forming the silicidation preventing regions to define open parts that expose the pair of sidewalls;

forming a metal-containing layer over the pairs of sidewalls exposed by the open parts;

forming a metal silicide layer in each body, of the plurality of bodies via annealing; and removing any remaining metal-containing layer.

5. The method of claim 1, wherein the buried bit lines comprise a cobalt silicide.

6. A method for fabricating a semiconductor device, the method comprising:

etching a silicon-containing substrate to form a plurality of bodies, having sidewalls, separated by a plurality of trenches, wherein each trench, of the plurality of trenches is defined by a pair of sidewalls of corresponding ones of the plurality of bodies;

forming a passivation layer on the pairs of sidewalls;

forming silicidation preventing regions in the substrate under the trenches;

etching the passivation layer to define open parts that are substantially co-planar with bottoms of the plurality of trenches and that expose the pair of sidewalls;

forming a metal-containing layer over the pairs of sidewalls exposed by the open parts;

forming a metal silicide layer through a full thickness of each body, of plurality of bodies by silicidating a portion of each body, of the plurality of bodies, that is exposed by the open parts;

removing any remaining metal-containing layer; and forming an interlayer dielectric layer to fill spaces between the plurality of bodies.

7. The method of claim 6, further comprising:

forming punch-through preventing regions in the substrate under the silicidation preventing regions before etching the passivation layer to define the open parts.

8. The method of claim 6, where forming the passivation layer comprises:

forming a first passivation layer over the pairs of sidewalls that define the plurality of trenches and over a surface of the silicon-containing substrate that defines bottoms of the plurality of trenches;

forming a sacrificial layer over the first passivation layer to partially fill each trench of the plurality of trenches;

forming a second passivation layer over the first passivation layer on the pairs of side ails;

removing the sacrificial layer; and removing portions of the first passivation layer that are formed over the surface of the silicon-containing substrate that defines bottoms of the plurality of trenches.

9. The method of claim 8, wherein etching the passivation layer to define the open parts further comprises:

removing exposed portions of the first passivation layer using the second passivation layer as an etch mask.

10. The method of claim 7, wherein forming the silicidation preventing regions further comprises:

ion-implanting fluorine into the substrate.

11. The method of claim 10, wherein the silicidation preventing regions comprise silicon fluoride regions.

12. The method of claim 6, wherein the metal silicide layer comprises a cobalt silicide layer.

13. A method for fabricating a semiconductor device, comprising:

etching a substrate to form a plurality of bodies, having sidewalls, separated by a plurality of trenches, wherein each trench, of the plurality of trenches is defined by a pair of sidewalls of corresponding ones of the plurality of bodies;

forming silicidation preventing regions in the substrate under each trench of the plurality of trenches;

performing silicidation on the pairs of sidewalls to form buried bit lines in each body, of the plurality of bodies, wherein lower surfaces of the buried bit lines are substantially aligned with bottoms of the plurality of trenches; and etching the plurality of to form a plurality of pillars that are to connect with corresponding capacitors and include channel regions for vertical channel transistors.

14. The method of claim 13, the method further comprising:

forming punch-through preventing regions in the substrate under the silicidation preventing regions before the forming the buried bit lines.

15. The method of claim 13, wherein forming the buried bit lines comprises:

forming a passivation layer on the pairs of sidewalls before forming the silicidation preventing regions;

removing portions of the passivation layer which are adjacent to a bottom of each trench, of the plurality of trenches, after forming the silicidation preventing regions to define open parts that expose the pair of sidewalls;

forming a metal-containing layer over the pair of sidewalls exposed by the open parts;

forming a metal silicide layer in each body, of the plurality of bodies via annealing; and removing any remaining metal-containing layer.

16. The method of claim 1 wherein the buried bit lines comprise a cobalt silicide.

17. A semiconductor device comprising:

a substrate;

a plurality of bodies defined in the substrate, where the plurality of bodies are separated from one another by trenches that are defined by sidewalls of the plurality of bodies and by a surface of the substrate;

buried bit lines, made of a metal silicide, formed in each of the plurality of bodies, where a bottom surface of each of the buried bit lines is substantially co-planar with surfaces defining bottoms of the trenches; and silicidation preventing regions formed in the substrate under the trenches, where the silicidation preventing regions are to prevent metal silicides from being formed in the substrate during a silicidation process.

18. The semiconductor device of claim 17, where the substrate comprises a silicon-containing substance, and the silicidation preventing regions comprise silicon-fluoride regions.

19. The semiconductor device of claim 17, further comprising:

punch-through preventing regions formed in the substrate under the silicidation preventing regions.

20. The semiconductor device of claim 17, wherein the metal silicide comprises a cobalt silicide.

21. The semiconductor device of claim 17, further comprising:

vertical channel transistors, including pillars that are formed over each of the plurality of bodies; and capacitors formed to be connected to the pillars.

* * * * *